US009338916B2

United States Patent
Yeh

(10) Patent No.: US 9,338,916 B2
(45) Date of Patent: May 10, 2016

(54) INTEGRATED CONTROLLER FOR ELECTRONIC APPARATUSES

(71) Applicant: ASUSTek COMPUTER INC., Taipei (TW)

(72) Inventor: Chin-Hsin Yeh, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 26 days.

(21) Appl. No.: 14/524,010

(22) Filed: Oct. 27, 2014

(65) Prior Publication Data

US 2015/0124414 A1 May 7, 2015

(30) Foreign Application Priority Data

Nov. 6, 2013 (TW) .............................. 102140204 A

(51) Int. Cl.
| | |
|---|---|
| *H05K 1/00* | (2006.01) |
| *H05K 1/18* | (2006.01) |
| *H05K 7/00* | (2006.01) |
| *H05K 7/02* | (2006.01) |
| *G05B 15/02* | (2006.01) |
| *H02G 3/00* | (2006.01) |
| *H02J 7/00* | (2006.01) |

(52) U.S. Cl.
CPC .......... *H05K 7/02* (2013.01); *G05B 15/02* (2013.01); *H02G 3/00* (2013.01); *H02J 7/00* (2013.01)

(58) Field of Classification Search
USPC ............................................. 361/748, 679.01
See application file for complete search history.

(56) References Cited

U.S. PATENT DOCUMENTS

| | | | | |
|---|---|---|---|---|
| 6,843,335 | B2 * | 1/2005 | Shirakawa | .......... B60L 11/1803 180/65.1 |
| 2010/0327766 | A1 * | 12/2010 | Recker | ...................... H02J 9/02 315/291 |
| 2014/0067143 | A1 | 3/2014 | Chen et al. | |

FOREIGN PATENT DOCUMENTS

| | | |
|---|---|---|
| CN | 101369136 A | 2/2009 |
| TW | 525855 U | 3/2003 |
| TW | M391037 | 10/2010 |
| TW | M425384 U | 3/2012 |
| TW | 201233238 A | 8/2012 |

* cited by examiner

*Primary Examiner* — Andargie M Aychillhum
(74) *Attorney, Agent, or Firm* — Alan D. Kamrath; Kamrath IP Lawfirm, P.A.

(57) ABSTRACT

An integrated controller for electronic apparatuses includes a host and an AC/DC converting module. The host includes at least one power terminal set to connect to an electronic apparatus. The power terminal set includes a power input terminal, a power output terminal and a power neutral terminal. The power input terminal is connected to a fire wire to receive AC power. The power output terminal is connected to a wire-input end of the electronic apparatus, and the power neutral terminal is connected to a wire-output end of the electronic apparatus. Therefore, the AC/DC converting module receives the AC power via the power input terminal and the power neutral terminal and converts the AC power to DC power which is required by the integrated controller. The integrated controller is mounted in an original position for a wall-embedded switch is positioned to replace the wall-embedded switch.

8 Claims, 6 Drawing Sheets

INTEGRATED CONTROLLER FOR ELECTRONIC APPARATUSES

CROSS-REFERENCE TO RELATED APPLICATION

This application claims the priority benefit of Taiwan application Ser. No. 102140204, filed on Nov. 6, 2013. The entirety of the above-mentioned patent application is hereby incorporated by reference herein and made a part of specification.

BACKGROUND OF THE INVENTION

1. Field of the Invention

The invention relates to a controller, more particularly, to an integrated controller for electronic apparatuses.

2. Description of the Related Art

In an integrated control system, for example, a smart home, various individual electronic appliances need to be integrated, such as a security monitor system, a light control system, an air conditioner, an audio apparatus and a network communication apparatus. As science technology develops, more and more electronic apparatuses will be included into an existed integrated control system.

When the integrated control system is built up, except for the functions of the electronic appliances, the spaces for disposing varies electronic appliances also should be considered. In order to save indoor space, the wall-mounted or wall-embedded electronic appliances are preferred.

However, if a user wants to integrate many electronic appliances disposed at different locations via one single controller to achieve an integrated control system, many electronic wires result home interior a mass because power wires and control wires of the controller has to connect to each of the electronic appliances for electronically connection.

BRIEF SUMMARY OF THE INVENTION

An integrated controller for electronic apparatuses is provided. The controller integrates into an electric power switch of electronic apparatuses which is more convenient and less physical wires are utilized.

An integrated controller for electronic apparatuses cooperates with an electric power switch to control at least one electronic apparatus. The electric power switch is connected to a fire wire and a control wire, and the electronic apparatus includes a wire-input end and a wire-output end. The integrated controller for electronic apparatuses includes a host and an AC/DC converting module. The host includes a control circuit board, a power terminal set and a plurality of control keys. The power terminal set includes a power input terminal, a power output terminal and a power neutral terminal. The power input terminal is connected to the fire wire to receive an alternating current (AC) power. The power output terminal is connected to the control wire, and the other end of the control wire is connected to the wire-input end of the electronic apparatus. The power neutral terminal is connected to the neutral wire, and the other end of the control wire is connected to the wire-output end of the electronic apparatus. Two input ends of the AC/DC converting module are connected to the power input terminal and the power neutral terminal, respectively, and the AC/DC converting module converts the AC power to a direct current (DC) power for the integrated controller for electronic apparatuses.

Thus, the host is used to control the power supply of the electronic apparatus, and since the neutral wire is connected between the wire-output end of the electronic apparatus and the power neutral terminal of the host, a complete power circuit is formed via the fire wire and the neutral wire for the host. The host converts the AC power from the fire wire to the DC power via the AC/DC converting module, so as to dispose the integrated controller for electronic apparatuses at a position for a wall-embedded switch.

These and other features, aspects and advantages of the present invention will become better understood with regard to the following description, appended claims, and accompanying drawings.

DETAILED DESCRIPTION OF THE EMBODIMENTS

Figure 1:
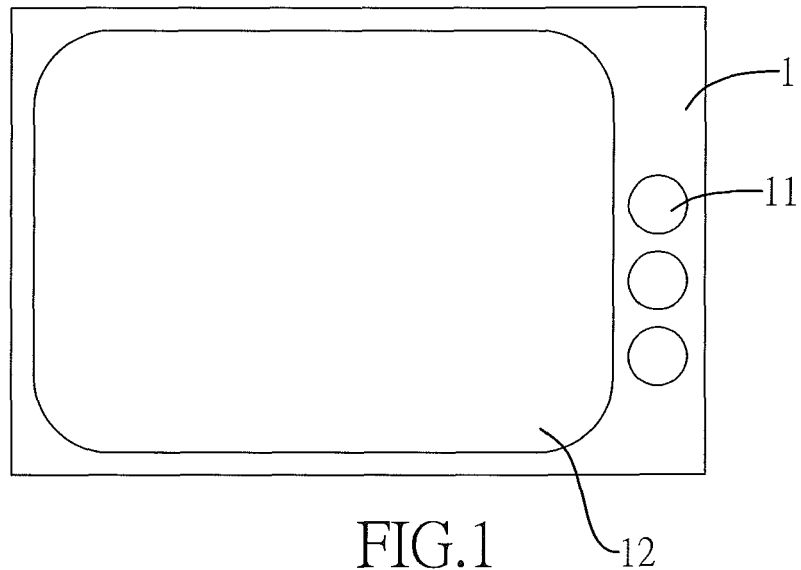
FIG. 1 is a front view showing an integrated controller for electronic apparatuses including physical control keys in a first embodiment.
Figure 4:
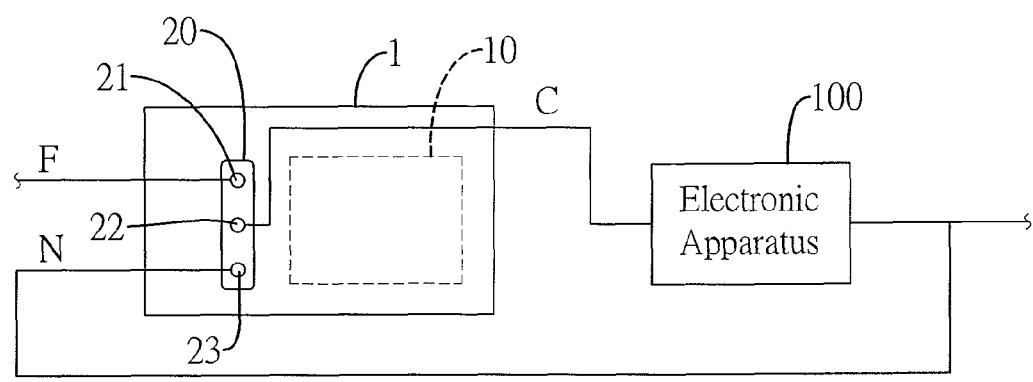
FIG. 4 is a schematic diagram showing a wire connection of an integrated controller for electronic apparatuses in an embodiment.

Please refer to FIG. 1 and FIG. 4, an integrated controller for electronic apparatuses includes a host 1, and a control circuit board 10 is disposed inside. The host 1 integrates into an electric power switch to receive a working power from a fire wire and a control wire but also remains the functions of the electric power switch. It is to be understood that other functions of the host 1, such as data transmission with other hosts wired or wirelessly and a smart control function, can be referenced to common hosts of electronic apparatuses and which are omitted herein.

The host 1 includes a plurality of control keys 11. In the embodiment, the control keys 11 are physical keys and disposed at the front side of the host 1 to facilitate pressing. The control keys 11 have a function of power switch or function setting, which is not limited herein. The host 1 further includes a display screen 12, such as a liquid crystal display (LCD) screen and a touch control screen. The display screen 12 displays an operation setting state of the host 1 or a state of a load connected to the host.

Figure 2:
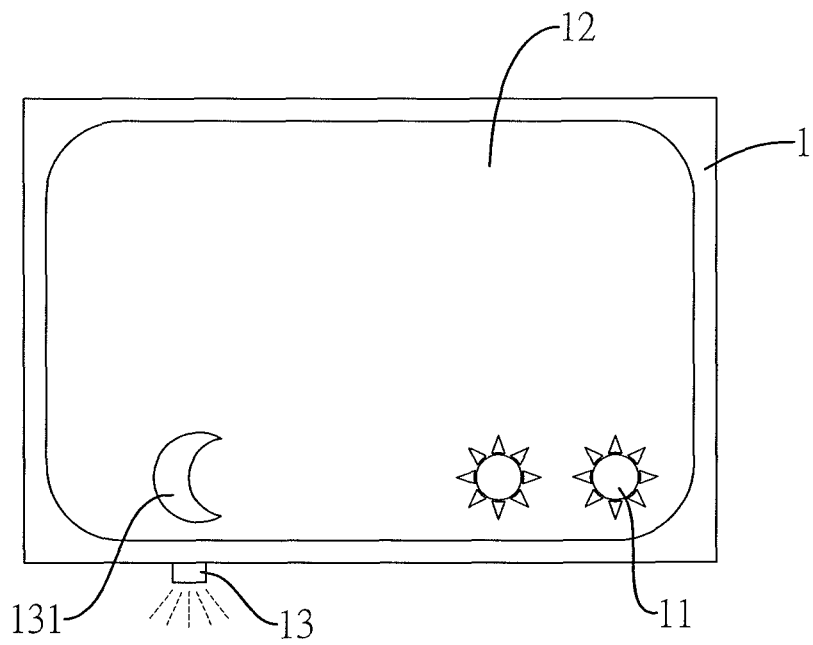
FIG. 2 is a front view showing an integrated controller for electronic apparatuses including virtual control keys in a second embodiment.

Please refer to FIG. 2, in the embodiment, when the display screen 12 is a touch control screen, the control keys 11 are virtual keys which are displayed at the touch control screen as an icon or an image. When the user clicks the virtual key, a corresponding function is enabled.

In the embodiment shown in FIG. 2, the host 1 further includes a built-in light source 13 to provide auxiliary light. In an embodiment, the built-in light source 13 is an LED. The light source 13 on the host 1 is used as a night light or a wall light, which is an extra function to the integrated controller. When the built-in light source 13 is turned on, a light on icon 131 is displayed at the display screen 12 correspondingly.

Figure 3:
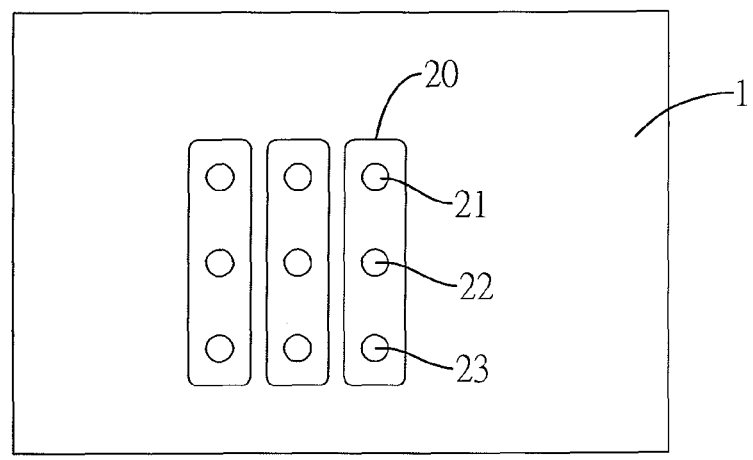
FIG. 3 is a back view showing an integrated controller for electronic apparatuses in an embodiment.

Please refer to FIG. 3, a plurality of power terminal sets 20 are disposed at a back side of the host 1. Each of the power terminal sets 20 is connected to an electronic apparatus, and the host 1 controls the power supply state of the electronic apparatus. Each of the power terminal sets 20 includes a power input terminal 21, a power output terminal 22 and a power neutral terminal 23.

FIG. 4 is a schematic diagram showing a wire connection of an integrated controller for electronic apparatuses when the host 1 is disposed at a position of the electric power switch. Taking one of the power terminal sets 20 as an example, the power input terminal 21 is connected to a fire wire F of the circuit, and the power output terminal 22 is connected to a control wire C of the circuit. The electronic apparatus 100 includes a wire-input end and a wire-output end, and the other end of the control wire C is connected to the wire-input end of the electronic apparatus 100. The wire-output end of the electronic apparatus 100 is connected to a neutral wire N, and the neutral wire N is connected to the power neutral terminal 23 of the host 1.

As stated above, the host 1 controls the power supply of the electronic apparatus 100 just like the electric power switch does, and it also converts AC power to DC power. When the host 1 is connected to the power input terminal 21 and the power output terminal 22, the AC power transmits to the electronic apparatus 100 via the fire wire F, the host 1 and the control wire C to supply power to the electronic apparatus 100. On the contrary, if the power transmission between the power input terminal 21 and the power output terminal 22 is interrupted, the electronic apparatus 100 is turned off. Thus, similar to a switch, the host 1 also controls the power supply of the electronic apparatus 100.

Figure 5:
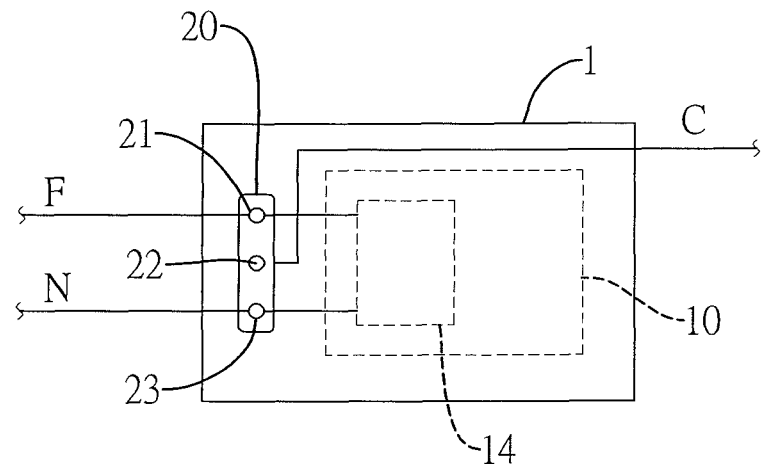
FIG. 5 is a schematic diagram showing that an integrated controller for electronic apparatuses converts an AC power to a DC power in a first embodiment.

Please refer to FIG. 5, since the wire-output end of the electronic apparatus 100 is connected to the neutral wire N, and the neutral wire N is connected to the power neutral terminal 23 of the host 1, the host 1 obtains a complete power circuit via the fire wire F and the neutral wire N. The host 1 further includes an AC/DC converting module 14. Two input ends of the AC/DC converting module 14 are connected to the power input terminal 21 and the power neutral terminal 23, respectively. Thus, the host 1 converts the AC power at the fire wire F to the DC power, and the host 1 obtains the needed DC power from the AC/DC converting module 14. The AC/DC converting module 14 may be an external apparatus or a built-in circuit. For example, as shown in FIG. 5, the AC/DC converting module 14 is an AC/DC converting circuit built at the control circuit board 10.

Figure 6:
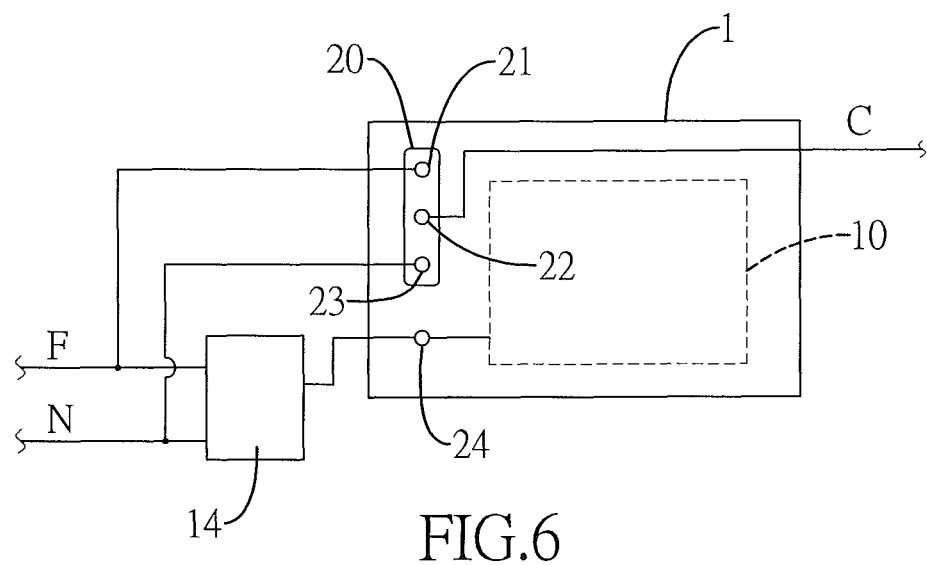
FIG. 6 is a schematic diagram showing that an integrated controller for electronic apparatuses converts an AC power to a DC power in a second embodiment.
Figure 9:
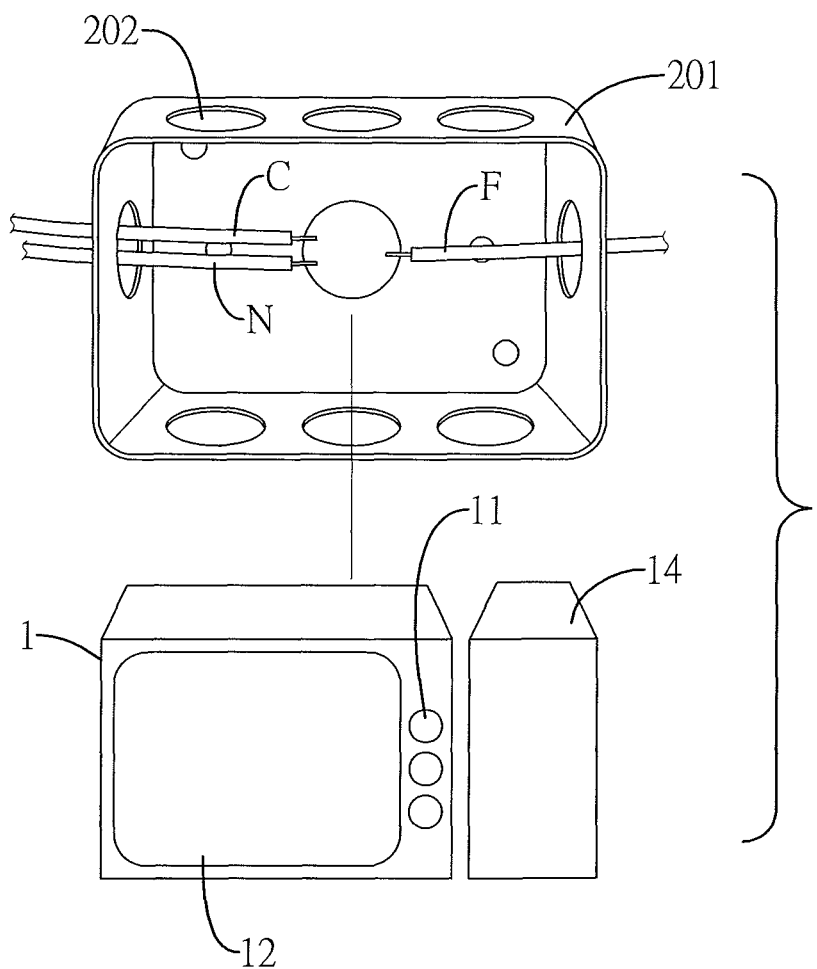
FIG. 9 is a schematic diagram showing an integrated controller for electronic apparatuses disposed a position for a wall-embedded switch in a third embodiment.

Please refer to FIG. 6 and FIG. 9, the host 1 may include a DC power input hole 24, and the host 1 cooperates with an external AC/DC transformer used as the AC/DC converting module 14. The fire wire F and the neutral wire N are connected to the power input terminal 21 and the power neutral terminal 23, and the fire wire F and the neutral wire N are also connected to an input end of the AC/DC transformer. After the AC/DC transformer converts the AC power to the DC power, it transmits the DC power to the host 1 via the DC power input hole 24.

Figure 7:
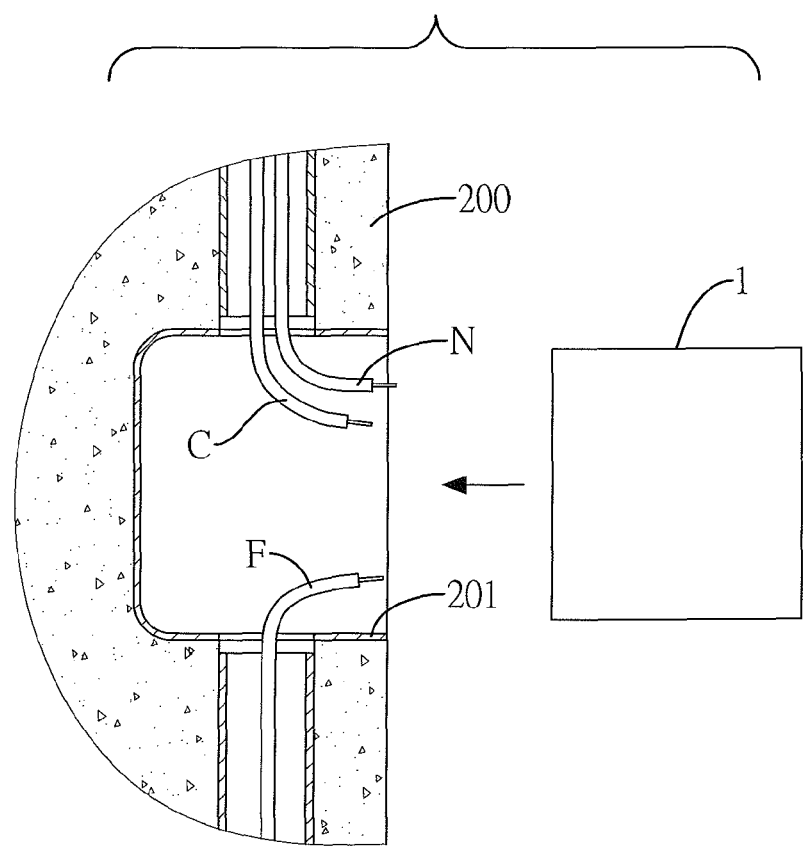
FIG. 7 is a schematic diagram showing an integrated controller for electronic apparatuses disposed at a position for a wall-embedded switch in a first embodiment.

Please refer to FIG. 7, in assembly, a panel of a switch box 201 on the wall 200 is detached, and the existed switch module is separated from the switch box 201 and is taken out. Then, the host 1 is disposed in the switch box 201, and the corresponding circuit is connected to the power terminal sets 20 according to the wire connecting method shown in FIG. 4. If the AC/DC converting module 14 is an external AC/DC transformer, it is also disposed in the switch box 201.

Figure 8:
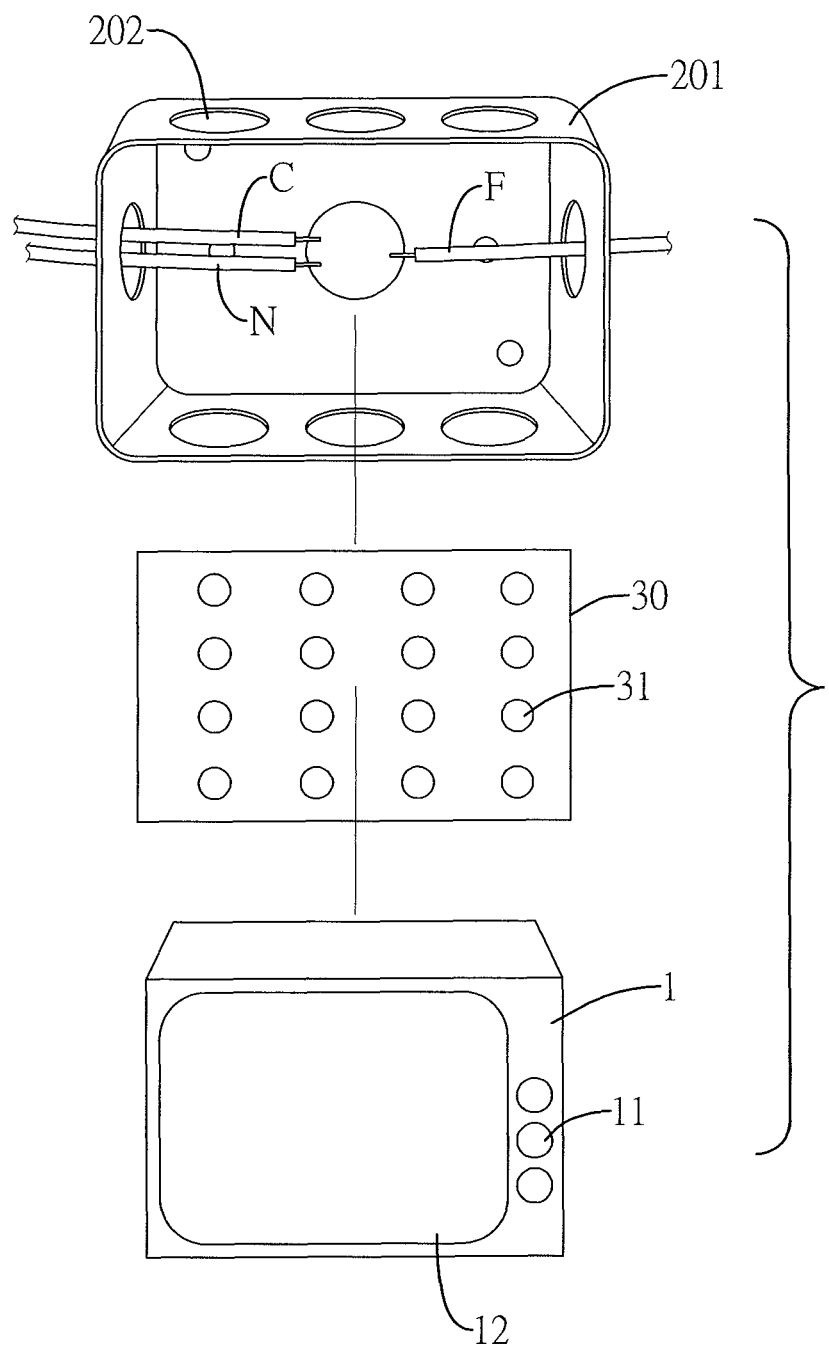
FIG. 8 is a schematic diagram showing an integrated controller for electronic apparatuses disposed at a position for a wall-embedded switch in a second embodiment.

Please refer to FIG. 7 to FIG. 9, several holes 202 are formed at the switch box 201 for screwing and fixing the switch module. The host 1 is directly fixed to the switch box 201 via the holes 202. However, if the positions of the holes 202 do not match with the host 1, the host 1 is also fixed to the switch box 201 via a fixing backboard 30 as shown in FIG. 8, and multiple fixing holes 31 are formed in a matrix arrangement at the fixing backboard 30. Since the fixing backboard 30 has multiple fixing holes 31, the fixing holes 31 corresponding to the holes 202 are selected, and the fixing backboard 30 is fixed to the switch box 201 via the selected fixing holes 31, then the host 1 is fixed to the fixing backboard 30, which solves the problem that the positions of the holes 202 do not match with the host 1. As shown in FIG. 9, if the AC/DC converting module 14 is an external AC/DC transformer, both of the AC/DC transformer and the host 1 are disposed in the switch box 201.

In sum, the integrated control system is conveniently disposed in a position of an existed switch in a building, and thus the building structure does not need to be reformed greatly. The integrated control system controls different electronic apparatuses and provide a DC power in a wiring way according to embodiments.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. An integrated controller for electronic apparatuses, cooperating with an electric power switch with a fire wire and a control wire, and the electronic apparatus includes a wire-input end and a wire-output end, the integrated controller comprising:

a host including a control circuit board, at least one power terminal set and a plurality of control keys, wherein the power terminal set includes:

a power input terminal connected to the fire wire to receive an alternating current (AC) power;

a power output terminal connected to the control wire, wherein the other end of the control wire is connected to the wire-input end of the electronic apparatus; and a power neutral terminal connected to a neutral wire, wherein the other end of the neutral wire is connected to the wire-output end of the electronic apparatus; and an AC/DC converting module connected to the power input terminal and the power neutral terminal, respectively, to convert the AC power to a direct current (DC) power.

2. The integrated controller for electronic apparatuses according to claim 1, wherein the AC/DC converting module is an individual AC/DC transformer.

3. The integrated controller for electronic apparatuses according to claim 1, wherein the AC/DC converting module is a built-in AC/DC converting circuit on the control circuit board.

4. The integrated controller for electronic apparatuses according to claim 1, wherein the host includes a display screen.

5. The integrated controller for electronic apparatuses according to claim 4, wherein the display screen is a liquid crystal display (LCD) screen, and the control key is a physical key disposed at the host.

6. The integrated controller for electronic apparatuses according to claim 4, wherein the display screen is a touch control screen, and the control key is a virtual key displayed at the touch control screen.

7. The integrated controller for electronic apparatuses according to claim 1, wherein the integrated controller further includes a fixing backboard, the fixing backboard is disposed at a switch box on a wall, and the host is fixed to the fixing backboard.

8. The integrated controller for electronic apparatuses according to claim 7, wherein the host includes a built-in light source.

* * * * *